United States Patent
Uribe et al.

(10) Patent No.: US 7,630,695 B2
(45) Date of Patent: Dec. 8, 2009

(54) RECEIVER SIGNAL STRENGTH INDICATOR

(75) Inventors: Julian Uribe, Chula Vista, CA (US); Wei Fu, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 495 days.

(21) Appl. No.: 11/786,512

(22) Filed: Apr. 12, 2007

(65) Prior Publication Data
US 2008/0252337 A1    Oct. 16, 2008

(51) Int. Cl.
H04B 17/02    (2006.01)
(52) U.S. Cl. ............... 455/134; 455/161.3; 455/226.2; 455/277.2
(58) Field of Classification Search ........... 455/134, 455/161.3, 226.2, 277.2, 67.11, 132, 135, 455/226.1, 334, 513, 522, 355; 375/316, 375/320, 353, 331–332; 370/207, 332
See application file for complete search history.

(56) References Cited

U.S. PATENT DOCUMENTS

| | | | |
|---|---|---|---|
| 4,531,235 A * | 7/1985 | Brusen | 455/273 |
| 6,246,867 B1 * | 6/2001 | Jakobsson | 455/324 |
| 7,092,706 B2 * | 8/2006 | Yang | 455/423 |
| 7,130,601 B2 * | 10/2006 | Khorram | 455/226.2 |
| 7,395,043 B2 * | 7/2008 | Atsumi | 455/226.2 |
| 7,450,958 B2 * | 11/2008 | Shim et al. | 455/513 |

* cited by examiner

Primary Examiner—Pablo N Tran
(74) Attorney, Agent, or Firm—Law Office of Gerald Maliszewski; Gerald Maliszewski

(57) ABSTRACT

A system and method are provided for measuring the amplitude of a received signal. The method receives an analog input signal, and compares a peak value of the analog input signal to a threshold level. Threshold transition data is generated, and the threshold level is adjusted in response to the transition data. The above-mentioned processes of comparing, generating, and adjusting are reiterated until the threshold level is about equal to the analog input signal peak value. As a result, a measurement of the analog input signal peak value is supplied. In one aspect, threshold transition data is converted into a digital value. Then, the measurement of the analog input signal peak value uses the digital value to represent the analog input signal peak value. Further, the digital value is converted into an analog voltage as feedback, and the analog voltage is used as the threshold level.

18 Claims, 4 Drawing Sheets

RECEIVER SIGNAL STRENGTH INDICATOR

BACKGROUND OF THE INVENTION

1. Field of the Invention

This invention generally relates to communications circuitry and, more particularly, to a receiver signal strength indicator (RSSI) for measuring the amplitude of a received signal.

2. Description of the Related Art

RSSI circuits are been widely used to detect the strength of an incoming signal in many communication devices. Typically, these circuits use analog circuitry to convert the received voltage to power, and then convert the analog power to a digital value using an analog-to-digital converter (ADC). However, high-speed RSSI devices have been difficult to implement in sub-micron CMOS processes. Conventional RSSI circuits often have a narrow dynamic range, low accuracy, consume high amounts of power, and operate at low speeds. Further, they can be sensitive to fabrication process variations.

In a typical RSSI circuit, input signals first go to a root mean square (RMS) converter, which converts the voltage to the RMS power. Then, the output of RMS converter goes to an ADC. The output of the ADC is a digital representation of the average input signal power, but not the magnitude. If magnitude is required, then some sort of the RMS back-to-magnitude conversion must be performed in the digital domain. Typically, a separate ADC is required for the translation of analog RMS power to a digital presentation. Likewise, a dedicated RMS-to-magnitude converter is required. The RMS converter is difficult to build, because the RMS value is a function of the input signal magnitude, slew rate, and modulation.

It would be advantageous if a simple, low-power, high-speed means existed for directly measuring an analog voltage and converting the analog measurement into a digital value, without the use of RMS conversions.

SUMMARY OF THE INVENTION

The RSSI system and method disclosed herein have several advantages over the above-mentioned prior are circuits. The present invention consumes relatively low power, since it avoids a step of voltage-to-power conversion. Digital elements of the RSSI permit the invention to be of a relatively small size, and to be flexibly controlled. The use of a high gain, high bandwidth comparator permits a theoretical RSSI measurement to be equal to that of the sensitivity of the comparator. In some aspects, a comparator can have a sensitivity of ~1 millivolt (mV). A robust digital detection algorithm permits the detection of noisy input signals, and the RSSI device incorporates a digital hysteresis feature. The use of a high gain common mode feedback circuit allows for a wide margin in the input common mode range of the incoming signal, in some aspects, ~540 mV common mode voltage variation. These features also permit the RRSI architecture to be used in serial communications loss of signal (LOS) measurements.

Accordingly, a method is provided for measuring the amplitude of a received signal. The method receives an analog input signal, and compares a peak value of the analog input signal to a threshold level. Threshold transition data is generated, and the threshold level is adjusted in response to the transition data. The above-mentioned processes of comparing, generating, and adjusting are reiterated until the threshold level is about equal to the analog input signal peak value. As a result, a measurement of the analog input signal peak value is supplied.

In one aspect, threshold transition data is converted into a digital value. Then, the measurement of the analog input signal peak value uses the digital value to represent the analog input signal peak value. Further, the digital value is converted into an analog voltage as feedback, and the analog voltage is used as the threshold level.

In another aspect of the method, comparing the peak value of the analog input signal to the threshold level includes: comparing a positive peak value of the analog input signal to an upper threshold level; and, comparing a negative peak value of the analog input signal to a lower threshold level. Then, generating threshold transition data includes generating positive and negative peak transition data. Likewise, adjusting the threshold level in response to the transition data includes: adjusting the upper threshold level in response to the positive peak transition data; and, adjusting the lower threshold level in response to the negative peak transition data. The measurement of the analog input signal peak value includes using the difference between the upper and lower threshold levels as a measurement of peak-to-peak input signal amplitude.

Additional details of the above-described method and receiver system for measuring the amplitude of a received signal are presented below.

DETAILED DESCRIPTION

Figure 1:
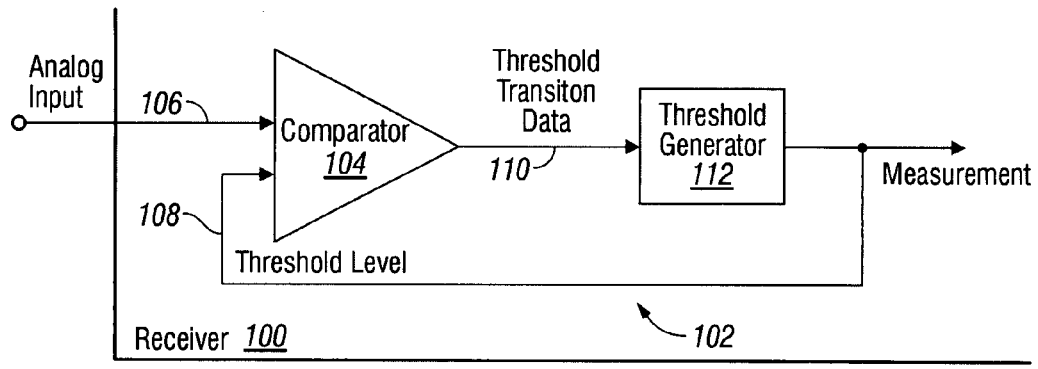
FIG. 1 is a schematic block diagram of a receiver with a system for measuring the amplitude of a received signal.

FIG. 1 is a schematic block diagram of a receiver with a system for measuring the amplitude of a received signal. The system 102 comprises a comparator 104 having an input on line 106 to accept an analog input signal, and an input on line 108 to accept a threshold level. The comparator 104 has an output on line 110 to supply threshold transition data in response to comparing a peak value of the analog input signal to the threshold level. A threshold generator 112 has an input on line 110 to accept the threshold transition data, and an output on line 108 to supply the threshold level, adjusted in response to the transition data. The threshold generator 112 reiteratively adjusts the threshold level until the threshold level is about equal to the analog input signal peak value, and supplies a measurement of the analog input signal peak value on line 108.

Figure 2:
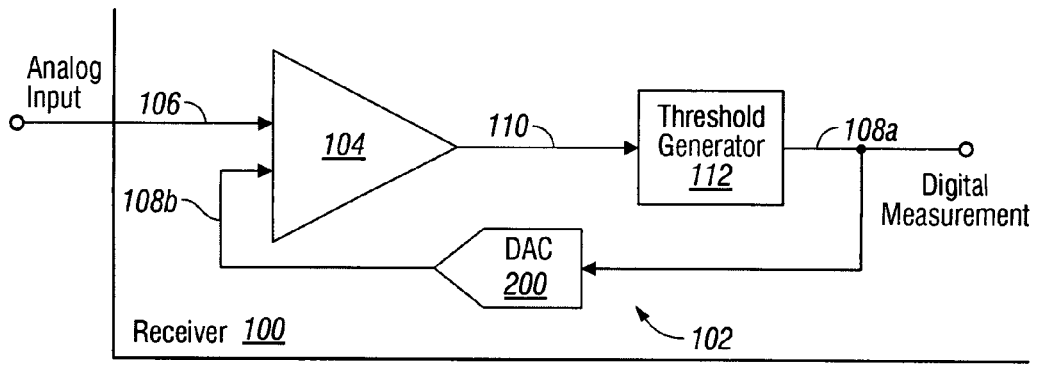
FIG. 2 is a schematic block diagram depicting a first variation to the system of FIG. 1.

FIG. 2 is a schematic block diagram depicting a first variation to the system of FIG. 1. In one aspect, the threshold generator 112 converts threshold transition data into a digital value, and uses the digital value to represent the measurement of the analog input signal peak value on line 108. A digital-to-analog converter (DAC) 200 has an input on line 108a to accept the digital value, and an output on line 108b to supply an analog threshold level.

Figure 3:
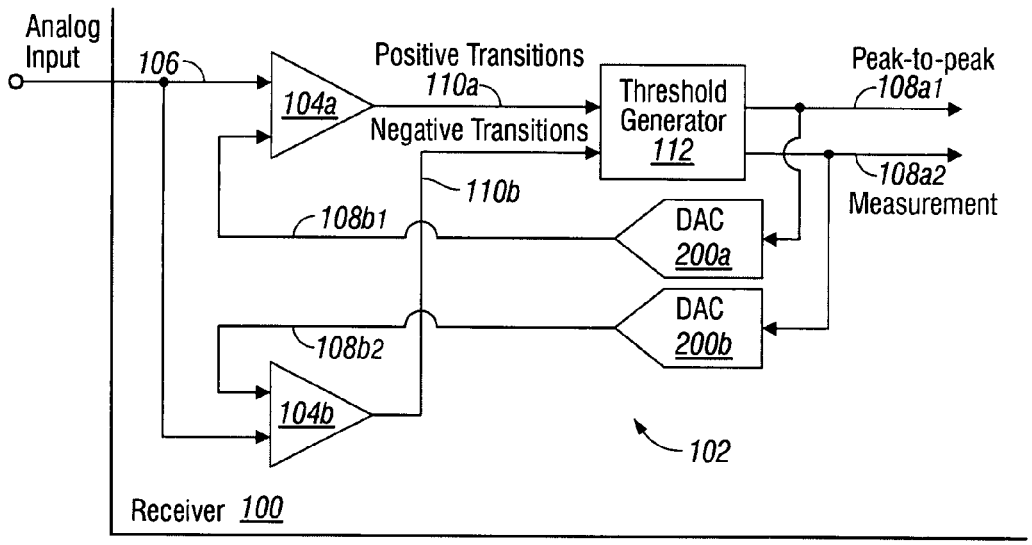
FIG. 3 is a schematic block diagram depicting a second variation of the system of FIG. 1.

FIG. 3 is a schematic block diagram depicting a second variation of the system of FIG. 1. The comparator 104 compares a positive peak value of the analog input signal on line 106 to an upper threshold level and generates positive peak transition data on line 110. Likewise, the comparator 104 compares a negative peak value of the analog input signal to a lower threshold level and generates negative peak transition data. Alternately as depicted, the system can be enabled with a positive threshold comparator 104a and a negative threshold comparator 104b, supplying transition data on lines 110a and 110b, respectively.

The threshold generator 112 adjusts the upper threshold level 108a1 in response to the positive peak transition data, and adjusts the lower threshold level 108a2 in response to the negative peak transition data. The difference between the upper and lower threshold levels can be used as a measurement of peak-to-peak input signal amplitude. In another variation not shown, the system 102 can be enabled with separate positive and negative threshold generators.

Figure 4:
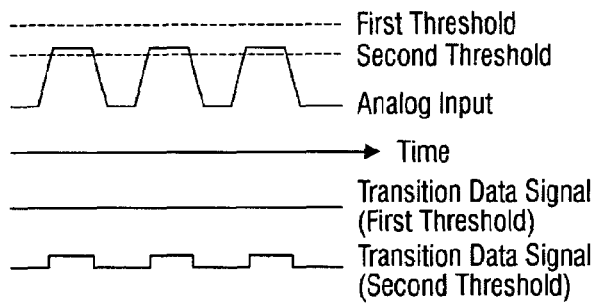
FIG. 4 is a graph depicting a first example of analog input voltage and threshold voltage as a function of time.

FIG. 4 is a graph depicting a first example of analog input voltage and threshold voltage as a function of time. In this example, the comparator (e.g., comparator 104 of FIG. 2) compares a first peak value to a first threshold level, greater (or equal) in amplitude than the first peak value. As a result, no transition data signals are generated in response to the first peak value failing to meet the first threshold. Returning to FIG. 2, the threshold generator 112 generates a lower-adjusted digital value on line 108a in response to the lack of transition data signals. The DAC 200 receives the lower-adjusted digital value and supplies a lower-adjusted analog voltage as a second threshold level on line 108b. For example, the threshold generator 112 may generate a lower-adjusted digital value one least significant bit (LSB) lower in value from the previous digital value.

Figure 5:
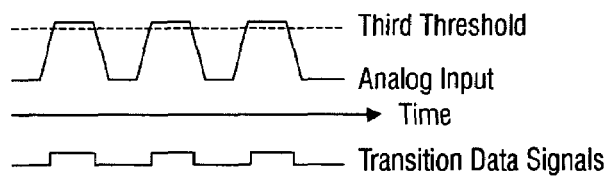
FIG. 5 is a graph depicting a second example of analog input voltage and threshold voltage as a function of time.

FIG. 5 is a graph depicting a second example of analog input voltage and threshold voltage as a function of time. In this example, the comparator compares the first peak value to a third threshold level, lower in amplitude than the first peak value, and generates threshold transition data signals in response to the first peak value exceeding the third threshold. Then, the threshold generator 112 of FIG. 2 generates an upper-adjusted digital value on line 108a in response to the transition data signals on line 110. In one aspect, the threshold generator simply responds to the occurrence of transition data. Alternately, the threshold generator creates digital values that are response to the transition signal amplitude or pulse widths. The DAC 200 receives the upper-adjusted digital value and supplies an upper-adjusted analog voltage as a fourth threshold level on line 108b. In one aspect, the threshold generator 112 generates an upper-adjusted digital value one LSB higher in value from the previous digital value.

Returning to FIG. 4, the comparator compares the first peak value to the second threshold level and generates transition data signals in response to the first peak value being exceeding the second threshold. In this example, the first threshold is slightly higher that the peak analog input value, and the second threshold is slightly lower than the peak analog input value. This example also assumes that the analog input remains constant. The threshold generator creates digital values corresponding to the first and second threshold levels that differ by one LSB.

Functional Description

Figure 6:
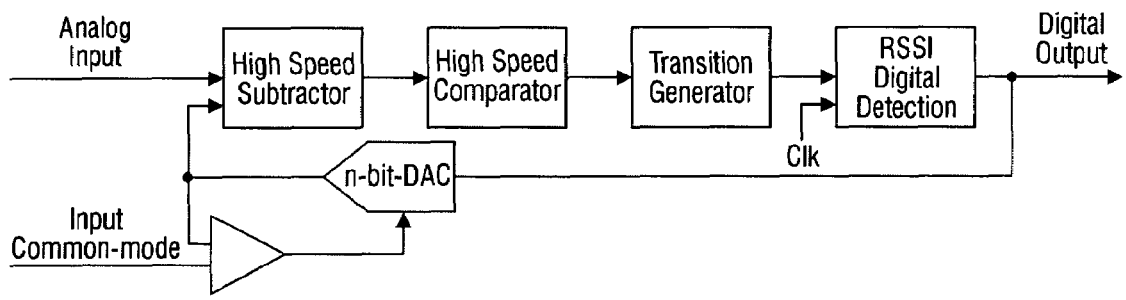
FIG. 6 is a schematic block diagram depicting a more detailed variation of the system shown in FIG. 2.

FIG. 6 is a schematic block diagram depicting a more detailed variation of the system shown in FIG. 2. This system receives the high-speed incoming analog signal, and outputs an n-bit digital word that is proportional to the input voltage magnitude. A high-speed level comparator, an n-bit DAC, and digital control logic are used to form a negative feedback loop. The loop is used to sense the input amplitude in a successive approximation method. The final n-bit DAC information is the digital representation of the received input voltage magnitude. The high-speed comparator is used to compare the input signal with a pre-defined voltage reference, which is generated by the n-bit DAC. The digital control logic controls the output of the DAC based on the information provided by the output of the comparator.

A high gain common mode (CM) feedback loop is used to set the common mode output of the DAC to the input common mode level, so that both AC and DC coupling input can be used. A high-speed subtractor is used for subtracting an input differential signal from on-chip DAC differential signal. A high-speed comparator is used to boost the difference signal to rail to rail for generating transition data.

Figure 7:
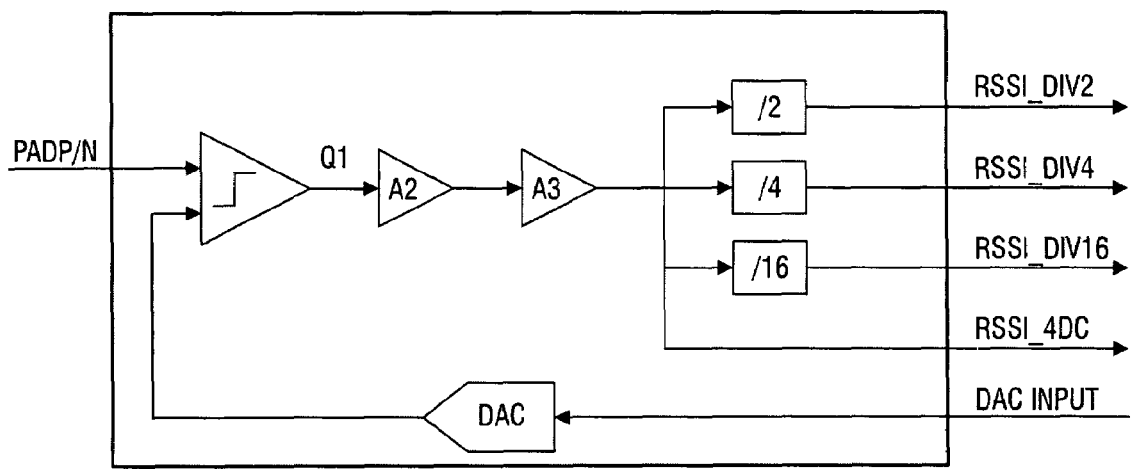
FIG. 7 is a schematic block diagram depicting some aspects of the system of FIG. 6 in greater detail.

FIG. 7 is a schematic block diagram depicting some aspects of the system of FIG. 6 in greater detail. The transition generator may consist of several different asynchronous dividers (e.g., divide by 2, 4, or 16) derived from output of the high-speed comparator. These different dividers are triggered by both rising edges and falling edges. One purpose of the threshold generator is to ensure that the digital RSSI detection block, which is sampled by an asynchronous clock, can fully detect the transitions of the high-speed comparator outputs.

The RSSI digital detection circuitry combines binary search with tracking algorithms. More explicitly, the RSSI digital detection algorithms perform a binary search of the incoming input signal, track the input signal level to ensure accurate readings, and perform some basic calculations on the resultant voltage levels. The binary search algorithm is a coarse acquisition process that quickly finds an approximation of the input voltage magnitude. The tracking algorithm, with step changes=1 LSB, accurately determines the input voltage magnitude and tracks input voltage variations.

Figure 8:
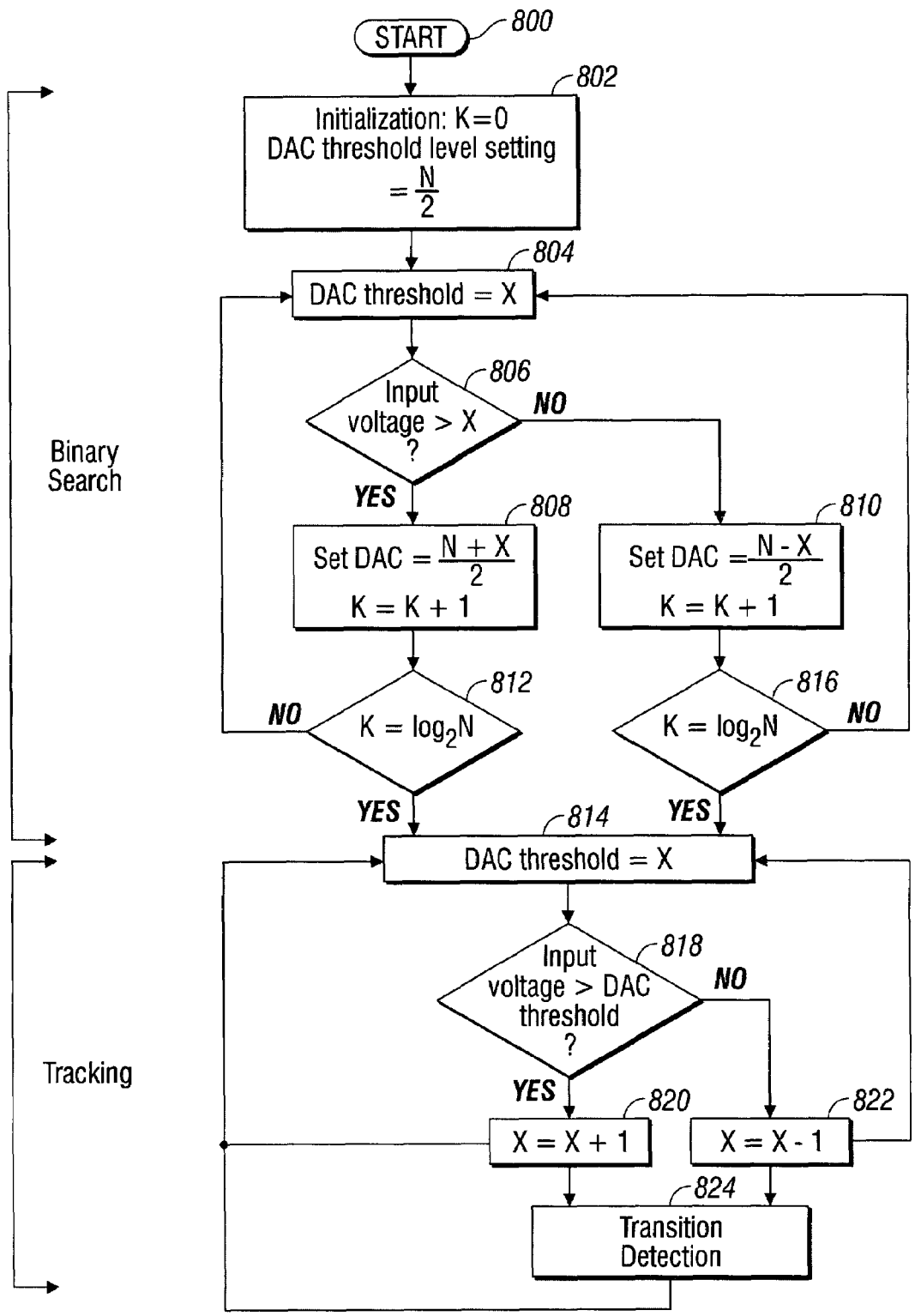
FIG. 8 is a flowchart illustrating an exemplary RSSI detection algorithm.

FIG. 8 is a flowchart illustrating an exemplary RSSI detection algorithm. The process starts at Step 800. In Step 802 the process is initialized, setting K=0, and the DAC threshold is set to N/2. For example, N may be equal to 256. In Step 804 the current value of the DAC threshold is set=X. A decision is made in Step 806. If the input voltage being measured is greater than X, then the process goes to Step 808. Otherwise, the process goes to Step 810. In Step 808, the DAC threshold is set equal to (N+X)/2 and K is incremented. Note: alternate equations may be used to move the threshold. If $K=\log_2 N$ (Step 812) the process continues to Step 814 where the DAC threshold is set to X. The process is not necessarily limited to the above-described value of N, or the above-referenced equation for selecting the limit for K. Otherwise, the process goes back to Step 804 where the current DAC threshold is set to X. In Step 810, the DAC threshold is set equal to (N−X)/2 and K is incremented. If $K=\log_2 N$ (Step 816) the process continues to Step 814 where the DAC threshold is set to X. Otherwise, the process goes back to Step 804 where the current DAC threshold is set to X, and the binary search is continued.

After processing the predetermined number of coarse acquisition steps established in Steps 812 and 816, the tracking algorithm begins. Step 818 decides if the input voltage is greater than the DAC threshold. If so, Step 820 increments the value of X. Typically, the increments are in units of the LSB. Otherwise, Step 822 decrements the value of X. Step 824 supplies the DAC threshold as the input voltage measurement, and represents a transition between Step 820 and Step 822. For example, the detection block may currently process Step 820, and after returning to Steps 814 and 818, proceed to Step 822 instead of Step 820. When the process alternately transitions between Steps 820 and 822, the DAC setting is very close to the analog input voltage. Then, Step 824 supplies the DAC threshold as the input voltage measurement, and the process returns to Step 814.

Figure 9:
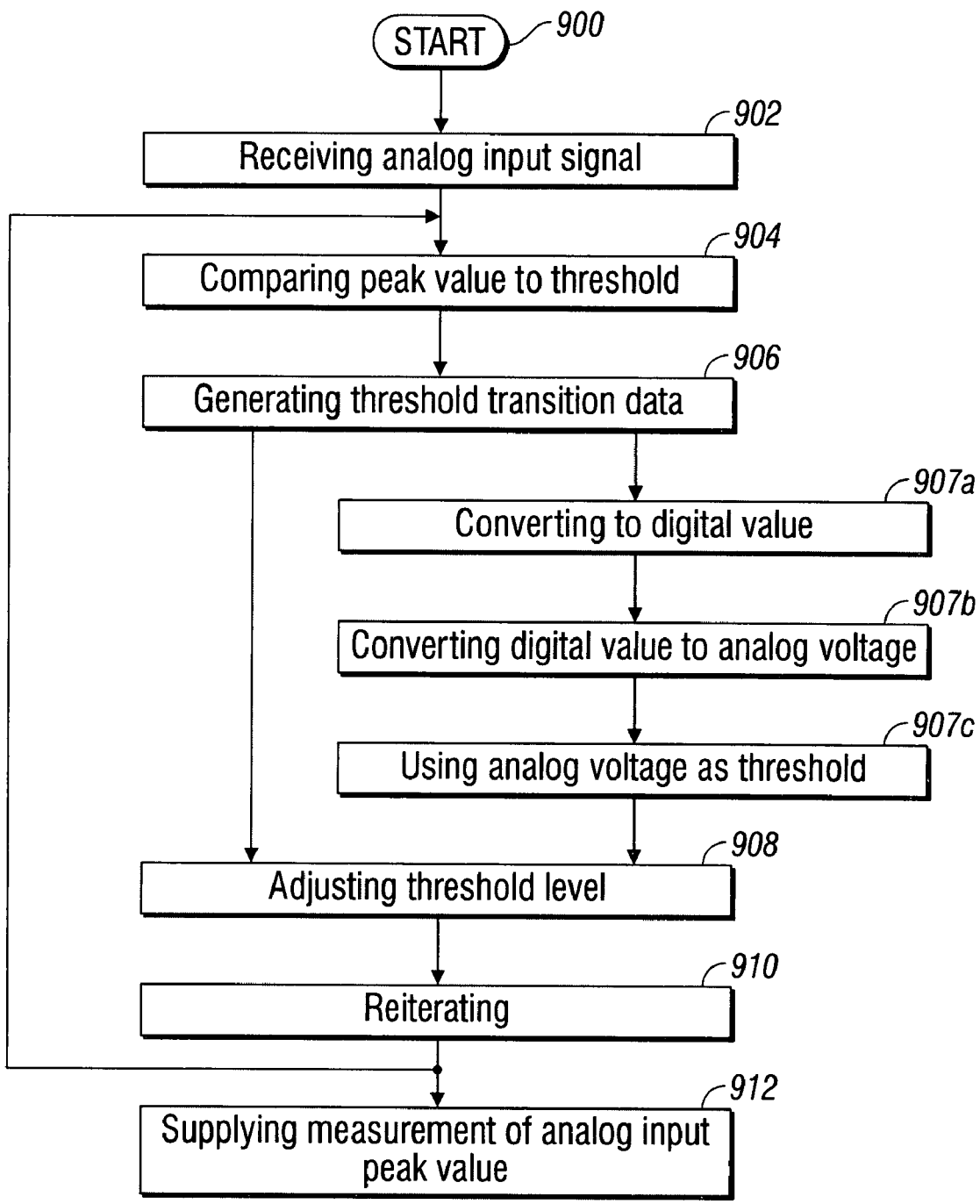
FIG. 9 is a flowchart illustrating a method for measuring the amplitude of a received signal in a receiver.

FIG. 9 is a flowchart illustrating a method for measuring the amplitude of a received signal in a receiver. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 receives an analog input signal. Step 904 compares a peak value of the analog input signal to a threshold level. Step 906 generates threshold transition data. Step 908 adjusts the threshold level in response to the transition data. Step 910 reiterates the above-mentioned processes of comparing, generating, and adjusting (Steps 904, 906, and 908) until the threshold level is about equal to the analog input signal peak value. Step 912 supplies a measurement of the analog input signal peak value.

In one aspect, Step 907a converts threshold transition data into a digital value. Then, supplying the measurement of the analog input signal peak value in Step 912 includes using the digital value to represent the analog input signal peak value. In a different aspect, Step 907b converts the digital value into an analog voltage, and Step 907c uses the analog voltage as the threshold level.

In one aspect, comparing the peak value of the analog input signal to the threshold level in Step 904 includes: comparing a positive peak value of the analog input signal to an upper threshold level; and, comparing a negative peak value of the analog input signal to a lower threshold level. Likewise, generating threshold transition data in Step 906 includes: generating positive peak transition data; and, generating negative peak transition data. Adjusting the threshold level in response to the transition data in Step 908 includes: adjusting the upper threshold level in response to the positive peak transition data; and, adjusting the lower threshold level in response to the negative peak transition data. Then, supplying the measurement of the analog input signal peak value in Step 912 includes using the difference between the upper and lower threshold levels as a measurement of peak-to-peak input signal amplitude.

For example, Step 904 may compare a first peak value to a first threshold level, greater in amplitude than the first peak value, and Step 906 generates no transition data signals in response to the first peak value failing to meet the first threshold. Then, converting threshold transition information into a digital value in Step 907a includes generating a lower-adjusted digital value. Step 907b converts the lower-adjusted digital value to a lower-adjusted analog voltage, and Step 907c uses the lower-adjusted analog voltage as a second threshold level. In one aspect, generating a lower-adjusted digital value in Step 907a includes generating a lower-adjusted digital value one LSB lower in value from the previous digital value.

To continue the example, Step 904 compares the first peak value the second threshold level, and Step 906 generates transition data signals in response to the first peak value being exceeding the second threshold. Then, converting threshold transition information into a digital value in Step 907a includes creating digital values corresponding to the first and second threshold levels that differ by one LSB.

In another example, Step 904 compares the first peak value to a third threshold level, lower in amplitude than the first peak value, and Step 906 generates transition data signals in response to the first peak value exceeding the third threshold. Then, Step 907a generates an upper-adjusted digital value, and Step 907b converts the upper-adjusted digital value to an upper-adjusted analog voltage. Step 907c uses the upper-adjusted analog voltage as a fourth threshold level. In one aspect, generating an upper-adjusted digital value in Step 907a includes generating an upper-adjusted digital value one LSB higher in value from the previous digital value.

A system and method have been providing for measuring the amplitude of a received signal. Circuit elements and search algorithm examples have been presented to illustrate the invention. However, the invention is not limited to merely these examples. Other variations and embodiments of the invention will occur to those skilled in the art.

We claim:

1. In a receiver, a method for measuring the amplitude of a received signal, the method comprising:
   receiving an analog input signal;
   comparing a peak value of the analog input signal to a threshold level;
   generating threshold transition data;
   adjusting the threshold level in response to the transition data;
   reiterating the above-mentioned processes of comparing, generating, and adjusting until the threshold level is about equal to the analog input signal peak value; and,
   supplying a measurement of the analog input signal peak value.

2. The method of claim 1 further comprising:
   converting threshold transition data into a digital value; and,
   wherein supplying the measurement of the analog input signal peak value includes using the digital value to represent the analog input signal peak value.

3. The method of claim 2 further comprising:
   converting the digital value into an analog voltage; and,
   using the analog voltage as the threshold level.

4. The method of claim 3 wherein comparing the peak value of the analog input signal to the threshold level includes:
   comparing a positive peak value of the analog input signal to an upper threshold level; and,
   comparing a negative peak value of the analog input signal to a lower threshold level;
   wherein generating threshold transition data includes:
   generating positive peak transition data; and,
   generating negative peak transition data;
   wherein adjusting the threshold level in response to the transition data includes:
   adjusting the upper threshold level in response to the positive peak transition data; and,
   adjusting the lower threshold level in response to the negative peak transition data; and, wherein supplying the measurement of the analog input signal peak value includes using the difference between the upper and lower threshold levels as a measurement of peak-to-peak input signal amplitude.

5. The method of claim 4 wherein comparing the peak value of the analog input signal to the threshold level includes comparing a first peak value to a first threshold level, greater in amplitude than the first peak value;
wherein generating threshold transition data includes generating no transition data signals in response to the first peak value failing to meet the first threshold;
wherein converting threshold transition information into a digital value includes generating a lower-adjusted digital value;
wherein converting the digital value into the analog voltage includes converting the lower-adjusted digital value to a lower-adjusted analog voltage; and,
wherein using the analog voltage as the threshold level includes using the lower-adjusted analog voltage as a second threshold level.

6. The method of claim 5 wherein generating a lower-adjusted digital value includes generating a lower-adjusted digital value one least significant bit (LSB) lower in value from the previous digital value.

7. The method of claim 5 wherein comparing the peak value of the analog input signal to the threshold level includes comparing the first peak value to a third threshold level, lower in amplitude than the first peak value;
wherein generating threshold transition data includes generating transition data signals in response to the first peak value exceeding the third threshold;
wherein converting threshold transition information into a digital value includes generating an upper-adjusted digital value;
wherein converting the digital value into the analog voltage includes converting the upper-adjusted digital value to an upper-adjusted analog voltage; and,
wherein using the analog voltage as the threshold level includes using the upper-adjusted analog voltage as a fourth threshold level.

8. The method of claim 5 wherein comparing the peak value of the analog input signal to the threshold level includes comparing the first peak value the second threshold level;
wherein generating threshold transition data includes generating transition data signals in response to the first peak value being exceeding the second threshold; and,
wherein converting threshold transition information into a digital value includes creating digital values corresponding to the first and second threshold levels that differ by one LSB.

9. The method of claim 7 wherein generating an upper-adjusted digital value includes generating an upper-adjusted digital value one LSB higher in value from the previous digital value.

10. In a receiver, a system for measuring the amplitude of a received signal, the system comprising:
a comparator having an input to accept an analog input signal, and input to accept a threshold level, and an output to supply threshold transition data in response to comparing a peak value of the analog input signal to the threshold level;
a threshold generator having an input to accept the threshold transition data and an output to supply an adjusted threshold level in response to the transition data; and,
wherein the threshold generator reiteratively adjusts the threshold level until the threshold level is about equal to the analog input signal peak value, and supplies a measurement of the analog input signal peak value.

11. The system of claim 10 wherein the threshold generator converts threshold transition data into a digital value, and uses the digital value to represent the measurement of the analog input signal peak value.

12. The system of claim 11 further comprising:
a digital-to-analog converter (DAC) having an input to accept the digital value and an output to supply an analog threshold level.

13. The system of claim 12 wherein the comparator compares a positive peak value of the analog input signal to an upper threshold level and generates positive peak transition data, and compares a negative peak value of the analog input signal to a lower threshold level and generates negative peak transition data; and,
wherein threshold generator adjusts the upper threshold level in response to the positive peak transition data, adjusts the lower threshold level in response to the negative peak transition data, and uses the difference between the upper and lower threshold levels as a measurement of peak-to-peak input signal amplitude.

14. The system of claim 13 wherein the comparator compares a first peak value to a first threshold level, greater in amplitude than the first peak value, and generates no transition data signals in response to the first peak value failing to meet the first threshold;
wherein the threshold generator generates a lower-adjusted digital value in response to a lack of transition data signals; and,
wherein the DAC receives the lower-adjusted digital value and supplies a lower-adjusted analog voltage as a second threshold level.

15. The system of claim 14 wherein the threshold generator generates a lower-adjusted digital value one least significant bit (LSB) lower in value from the previous digital value.

16. The system of claim 14 wherein the comparator compares the first peak value to a third threshold level, lower in amplitude than the first peak value, and generates threshold transition data signals in response to the first peak value exceeding the third threshold;
wherein the threshold generator generates an upper-adjusted digital value in response to the transition data signals; and,
wherein the DAC receives the upper-adjusted digital value and supplies an upper-adjusted analog voltage as a fourth threshold level.

17. The system of claim 14 wherein the comparator compares the first peak value the second threshold level and generates transition data signals in response to the first peak value being exceeding the second threshold; and,
wherein the threshold generator creates digital values corresponding to the first and second threshold levels that differ by one LSB.

18. The system of claim 16 wherein the threshold generator generates an upper-adjusted digital value one LSB higher in value from the previous digital value.

* * * * *